(12) United States Patent
Kurita

(10) Patent No.: US 7,621,996 B2
(45) Date of Patent: Nov. 24, 2009

(54) SILICON WAFER AND METHOD FOR PRODUCING SAME

(75) Inventor: Kazunari Kurita, Tokyo (JP)

(73) Assignee: Sumco Corporation, Tokyo (JP)

( * ) Notice: Subject to any disclaimer, the term of this patent is extended or adjusted under 35 U.S.C. 154(b) by 0 days.

(21) Appl. No.: 12/201,345

(22) Filed: Aug. 29, 2008

(65) Prior Publication Data

US 2009/0000537 A1  Jan. 1, 2009

Related U.S. Application Data

(62) Division of application No. 11/699,894, filed on Jan. 29, 2007, now Pat. No. 7,560,163.

(30) Foreign Application Priority Data

Jan. 31, 2006  (JP)  ............................. 2006-022831

(51) Int. Cl.
*C30B 15/00* (2006.01)

(52) U.S. Cl. ................. 117/20; 117/932; 257/E21.318; 257/E21.321

(58) Field of Classification Search ........................ None
See application file for complete search history.

(56) References Cited

U.S. PATENT DOCUMENTS

| | | | |
|---|---|---|---|
| 6,544,656 B1 | 4/2003 | Abe et al. | |
| 7,316,745 B2 | 1/2008 | Sadamitsu et al. | |
| 7,397,110 B2 | 7/2008 | Takase et al. | |
| 2005/0250349 A1 | 11/2005 | Sadamitsu et al. | |
| 2005/0253221 A1 | 11/2005 | Takase et al. | |
| 2007/0175385 A1 | 8/2007 | Kurita | |

FOREIGN PATENT DOCUMENTS

| | | |
|---|---|---|
| EP | 1326269 A1 | 7/2003 |
| EP | 1326270 A1 | 7/2003 |
| JP | 2002-100631 | 4/2002 |
| JP | 2002-100632 | 4/2002 |
| KR | 2002-46983 | 6/2002 |
| KR | 2005-35862 | 4/2005 |
| WO | WO00/55397 | 9/2000 |

OTHER PUBLICATIONS

Korean Office Action from corresponding Korean Patent No. 10-2007-0007283, mailed on Mar. 28, 2008 and its English translation.
Sueoka et al., "Effect of Oxide Precipitate Sizes on the Mechanical Strength of Czochralski Silicon Wafers," Jpn. J. Appl. Phys., vol. 36: pp. 7095-7099 (1997).
Akatsuka et al., "Pinning Effect on Punched-Out Dislocations in Silicon Wafers Investigated Using Indention Method," Jpn. J. Appl. Phys., vol. 36; pp. L1422-L1425 (1997).
A.R. Bean, et al., "The Effect of Carbon on Thermal Donor Formation in Heat Treated Pulled Silicon Crystals," The Journal of Physics and Chemistry of Solids, vol. 33, No. 2, pp. 255-268 (Apr. 1972).

*Primary Examiner*—Timothy M Speer
(74) *Attorney, Agent, or Firm*—Kolisch Hartwell, PC

(57) ABSTRACT

A method for producing a silicon wafer that has a carbon concentration of $5 \times 10^{15}$ to $5 \times 10^{17}$ atoms/cm$^3$, interstitial oxygen concentration of $6.5 \times 10^{17}$ to $13.5 \times 10^{17}$ atoms/cm$^3$, and a resistivity of 100 Ωcm or more.

4 Claims, 10 Drawing Sheets

SILICON WAFER AND METHOD FOR PRODUCING SAME

This application is a divisional under 35 U.S.C. §§ 120 and 121 of U.S. patent application Ser. No. 11/699,894 filed Jan. 29, 2007 and titled SILICON WAFER AND METHOD FOR PRODUCING SAME, which is hereby incorporated by reference for all purposes.

BACKGROUND OF THE INVENTION

1. Field of the Invention

The present invention relates to a high frequency diode, a silicon wafer that has high resistivity and preferably used in the high frequency diode, and a method for producing the silicon wafer. Priority is claimed on Japanese Patent Application No. No. 2006-022831 filed Jan. 31, 2006, the content of which is incorporated herein by reference.

2. Description of Related Art

Conventionally, PIN diodes, TRAPPATT diodes, and IMPATT diodes have been known as devices having a high resistivity layer (I layer: Intrinsic semiconductor layer) interposed between a PN junction, and are used as devices for high frequency switching. The high-resistivity layer is a drift region of minority carrier, and a property related to the switching rate of the diode is controlled by lifetime that is a time in which the minority carrier flows in the high-resistivity layer.

Conventionally, a silicon wafer made of an FZ crystal produced by the floating zone (FZ) method, a substrate made of a CZ crystal produced by the Czochralski method (CZ method) or the like have been used as substrates for production of high-frequency diodes having a high-resistivity layer, for example, a PIN diode. By the FZ method, it is easy to form a crystal having high resistance. Where the CZ crystal is used, the substrate is produced by forming a high resistance epitaxial layer (<100 Ωcm) on the silicon wafer made of the CZ crystal. In the high-resistivity layer of the above-described substrate, recombination centers are formed, for example, by thermally diffusing heavy metals such as Au and Pt to the substrate, or by introducing irradiation defects by electron beam irradiation.

However, where a high-frequency diode is produced using a silicon wafer made of the FZ crystal, it is impossible to avoid the use of a crystal having a small diameter since it is difficult to produce a crystal having a large diameter by the FZ method. Therefore, using the FZ crystal, it is impossible to expect the enhancement of the productivity of the high-frequency diode.

On the other hand, where a high-frequency diode is produced using a silicon wafer made of a CZ crystal which may have a large diameter, there have been the following problems. Since a crystal growth of the CZ crystal is performed using a quartz crucible, the CZ crystal has high interstitial oxygen concentration. During a heat treatment at about 350° C. to 450° C. in a device production process, oxygen in the CZ crystal generates oxygen donors such as thermal donors (Old Donors) and New Donors. Therefore, it has been difficult to ensure a desired resistivity because of the fluctuation of resistivity before and after the heat treatment in the device production process.

Usually, since a substrate has a resistivity of 10 Ωcm or less, oxygen donors generated during the device heat treatment process only have negligible influence on the resistance of the substrate. However, in a substrate of P type crystal having high resistance, generation of oxygen donors during the device heat treatment process increase the resistivity. In addition, if the generation of the oxygen donors is further increased, the oxygen donors override the P type impurities and generate an inversion from P type to N type resulting in a decrease of resistivity. Such phenomena remarkably fluctuates the resistivity. A method for producing a CZ crystal having low interstitial silicon concentration utilizing a magnetic field-applied Czochralski method (MCZ method) has been proposed as a method for inhibiting the above-described fluctuation of resistivity.

However, the use of silicon wafer made of the CZ crystal produced by the MCZ method and having low interstitial oxygen concentration includes problems such as an increase of production cost because of the application of the magnetic field and deterioration of mechanical strength of the silicon wafer after the device heat treatment because of the low interstitial oxygen concentration. In addition, since the device heat treatment of the silicon wafer having low interstitial oxygen concentration generates only a low density of oxygen precipitation induced defects, sufficient gettering ability could not be achieved in some cases.

The following patent references 1 through 3 describe techniques for solving the above-described problems.

Japanese Unexamined Patent Application, First Publication No. 2002-100631 (Patent Reference 1) describes a technique comprising growing a silicon single crystal ingot having a primary interstitial oxygen concentration of 10 to 25 ppma (JEIDA: Japanese Electronic Industry Development Association) [$7.9 \times 10^{17}$ to $19.8 \times 10^{17}$ atoms/cm$^3$ (Old-ASTM)] such that the silicon single crystal has a resistivity of 100 Ωcm or more; working tile silicon single crystal ingot into silicon wafers; and performing heat treatment of the wafers.

Japanese Unexamined Patent Application first Publication No. 2002-100632 (Patent Reference 2) describes a technique comprising: growing a silicon single crystal ingot by the CZ method such that the silicon single crystal ingot has a resistivity of 100 Ωcm or more and primary interstitial oxygen concentration of 10 to 25 ppma [$7.9 \times 10^{17}$ to $19.8 \times 10^{17}$ atoms/cm$^3$ (Old-ASTM)], and is doped with nitrogen; working the silicon single crystal ingot into wafers; and performing a heat treatment of the wafers, thereby controlling a residual interstitial oxygen concentration of the silicon wafers to be 8 ppma or less (JEIDA: Japanese Electronic Industry Development Association) [$6.32 \times 10^{17}$ atoms/cm$^3$ or less (Old-ASTM)].

PCT International Publication for Patent Application No. 00/55397 (Patent Reference 3) describes a technique comprising: growing a silicon single crystal ingot by the CZ method such that the silicon single crystal ingot and has a resistivity of 100 Ωcm or more and primary interstitial oxygen concentration of 10 to 25 ppma [$7.9 \times 10^{17}$ to $19.8 \times 10^{17}$ atoms/cm$^3$ (Old-ASTM)]; working the silicon single crystal ingot into wafers; and performing oxygen precipitation heat treatment of the wafers, thereby controlling a residual interstitial oxygen concentration of the silicon wafers to be 8 ppma or less [$6.32 \times 10^{17}$ atoms/cm$^3$ or less (Old-ASTM)].

According to the above-described techniques of Patent References 1 to 3, it is possible to depress the production cost by the use of a general CZ crystal having a high interstitial oxygen concentration and reduce the residual oxygen concentration of the wafer by the heat treatment of the wafer. Since the wafer has low residual interstitial oxygen concentration, it is possible to effectively depress the generation of oxygen donors during the device heat treatment process. In addition, it is possible to generate oxygen precipitation induced defects of high density in the bulk region by performing the oxygen precipitation heat treatment in order to reduce the residual interstitial oxygen concentration. The oxygen precipitation induced defects act as a gettering sink of heavy metals. Therefore, it is possible to expect the enhancement of the gettering ability.

However, in the techniques described in Patent References 1 to 3 using a silicon wafer having high interstitial oxygen concentration and high resistivity, it is necessary to perform a heat treatment of the silicon wafer at high temperature for a long time so as to generate oxygen precipitation induced defects of a high density and sufficiently reduce the residual interstitial oxygen concentration of the silicon wafers. Therefore, the following problems cannot be avoided.

Firstly, in the techniques described in Patent References 1 to 3, since the residual interstitial oxygen concentration is extremely reduced by the generation of an excessive amount of oxygen precipitation induced defects, there is a problem that the silicon wafer has low mechanical strength. The reduction of residual interstitial oxygen concentration of the silicon wafer may cause a deterioration of the mechanical strength of the silicon wafer. For example, this problem is obviously shown by the fact that slip length is reduced in accordance with increasing oxygen concentration (M. Akatsuka et al., Jpn. J. Appl. Phys., 36 (1997) L1422: non-patent reference 1) as a result of the slip dislocation occurring from the wafer support position or the like being fixed by the interstitial oxygen. In addition, it is known that the oxygen precipitation induced defect is a factor having influence on the strength and enhances the strength by inhibiting the movement of slip dislocation under conditions of lows heat and small dead weight stress. However, this reduces the strength by acting as a source of slip dislocation and tends to generate wafer-warpage or the like under conditions of high heat and large dead weight stress (K. Sueoka et al., Jpn. J. Appl. Phys., 36(1997)7095: non-patent reference 2). The heat and dead weight stress loaded on the silicon wafer during the device heat treatment process depend on the conditions of the heat treatment. In the techniques described in Patent References 1 to 3, mechanical strength of the silicon wafer is reduced to a low level.

Secondary, as described above, heat treatment at a high temperature for a long time is necessary in the techniques of Patent References 1 to 3. Therefore, there is a problem of the high production cost that accompanies the heat treatment. Although the production cost may be depressed by the use of a general CZ crystal having a high interstitial oxygen concentration, high frequency diode as the final product is expensive.

Third, the techniques of Patent Reference 1 to 3 have problems of heavy metal contamination of the silicon wafer within the heat treatment furnace during the time of heat treatment. For example, in Patent Reference 1, the duration of the heat treatment required to reduce the residual interstitial oxygen concentration is utmost 47 hours and at least 17 hours. Since the possibility of heavy metal contamination of the silicon wafer increases with increased heating time, there has been a high possibility of the silicon wafer suffering heavy metal contamination in the heat treatment furnace under the above-described heating condition with long duration.

Fourth, where a high-frequency diode having a high resistivity layer is produced using a silicon wafer described in Patent Reference 1 to 3, it is necessary to form recombination centers in the high-resistivity layer by the thermal diffusion of heavy metals such as Au and Pt into the substrate or by the introduction of irradiation defects by irradiating an electron beam. Therefore, production of the high-frequency diode costed substantial labor and a high production cost.

Under the consideration of the above-described circumstances, an object of the present invention is to provide a silicon wafer having a high resistance, being optimum for the production of a high frequency diode, having a sufficient density of oxygen precipitation induced defects needed for gettering, being able to effectively inhibit the generation of oxygen donors during the device heat treatment process, having sufficient mechanical strength, and being possible to be used as a high resistivity layer of a high frequency diode without requiring the formation of recombination centers in the high resistivity layer.

Another object of the invention is to provide a method for producing a silicon wafer, which is performed using a short heat treatment time and scarcely causing heavy metal contamination in the heat treatment furnace, and can be used for the production of the above-described silicon wafer with high quality and a low production cost.

Another object of the invention is to provide a silicon wafer which can be used for providing a high frequency diode having a high resistivity layer of sufficiently high resistivity and generating only few noise with low price.

Still another object of the present invention is to provide a silicon wafer having high resistivity and a method for producing the same which can be used for the production of a high resistivity diode with various advantages. The advantages include economical efficiency due to shortening the heat treatment of a wafer worked from a high resistance crystal grown by the CZ method, depressed generation of oxygen donors during the device production process, use of oxygen precipitation induced defects (oxygen precipitation nuclei or oxygen precipitates) as recombination centers, omission of the conventional formation process of recombination centers by thermal diffusion of heavy metals such as Au and Pt or by electron beam irradiation, use of the wafer having a high gettering ability and a high mechanical strength, controllability of lifetime, a high yield, and a low production cost.

SUMMARY OF THE INVENTION

In order to solve the above described problem, a silicon wafer of the present invention has a carbon concentration of $5\times10^{15}$ to $5\times10^{17}$ atoms/cm$^3$, an interstitial oxygen concentration of $6.5\times10^{17}$ to $13.5\times10^{17}$ atoms/cm$^3$, and a resistivity of 100 Ωcm or more.

The above-described silicon wafer may have an interstitial oxygen concentration of $6.5\times10^{17}$ to $10.0\times10^{17}$ atoms/cm$^3$.

The above-described silicon wafer may has a resistivity of 600 to 1000 Ωcm.

Where the above-described silicon wafer is applied to a production of a high frequency diode comprising a P type region, a N type region and a high resistivity layer interposed between the P type region and the N type region, oxygen precipitation induced defects generated in the silicon wafer may have a role of recombination centers in the high resistivity layer.

A method for producing a silicon wafer according to the present invention is a method for producing a silicon wafer having carbon concentration of $5\times10^{15}$ to $5\times10^{17}$ atoms/cm$^3$, interstitial oxygen concentration of $6.5\times10^{17}$ to $13.5\times10^{17}$ atoms/cm$^3$, and resistivity of 100 Ωcm or more. The method comprises: growing a silicon single crystal by the CZ method such that the silicon single crystal has a resistivity of 100 Ωcm or more, primary interstitial oxygen concentration of $8.0\times10^{17}$ to $16.0\times10^{17}$ atoms/cm$^3$, carbon concentration of $5\times10^{15}$ to $5\times10^{17}$ atoms/cm$^3$; and a first heat treatment so as to heat a silicon wafer sliced from the silicon single crystal ingot in an atmosphere composed of argon, nitrogen or a mixed gas of argon and nitrogen, where a heating temperature of the silicon wafer is increased from 700° C. to 1000° C. with a heating rate within a range of 1 to 2° C./min.

In the above-described method for producing a silicon wafer, in the first heat treatment, the silicon wafer may be retained for 0 to 6 hours at 1000° C.

The above-described method for producing a silicon wafer may further comprise a second heat treatment, where the silicon wafer is retained for 1 to 2 hours at 1200° C. in an atmosphere composed of argon, hydrogen or mixed gas of argon and hydrogen.

In the above-described method for producing a silicon wafer, the interstitial oxygen concentration of the wafer may be controlled to be $6.5 \times 10^{17}$ to $10.0 \times 10^{17}$ atoms/cm$^3$.

In addition, a silicon wafer according to the invention may be produced by any of the above-described method for producing a silicon wafer and has a resistivity of 600 to 1000 Ωcm.

Based on the consideration that the extreme reduction of residual interstitial oxygen concentration caused by generation of excess oxygen precipitation induced defects was the main problem in the prior art, the inventor examined a procedure to depress oxygen donors that contributed to the oxygen precipitation induced defects in the high-resistivity silicon wafer.

As a result, the inventor found that doping of the silicon wafer with carbon was oxygen concentration of the wafer may be controlled to be $6.5 \times 10^{17}$ to $10.0 \times 10^{17}$ atoms/cm$^3$.

In addition, a silicon wafer according to the invention may be produced by any of the above-described method for producing a silicon wafer and has a resistivity of 600 to 1000 Ωcm.

Based on the consideration that the extreme reduction of residual interstitial oxygen concentration caused by generation of excess oxygen precipitation induced defects was the main problem in the prior art, the inventor examined a procedure to depress oxygen donors that contributed to the oxygen precipitation induced defects in the high-resistivity silicon wafer.

As a result, the inventor found that doping of the silicon wafer with carbon was effective for the enhancement of the generation of oxygen precipitation induced defects, and was also effective for the depression of generation of oxygen donors, especially thermal donors.

The effect of carbon doping in the depression of oxygen donor generation is generally known in a silicon single crystal having the resistivity of 100 Ωcm or less (A. R. Bean et al., J. Phys. Chem. Solids, 1972, Vol. 33, pp 255-268: non-patent reference 3.) For example, in a case of usual CZ crystal having a resistivity of 10 Ωcm or less, necessary concentration of doped carbon for depressing the oxygen donors is $1 \times 10^{18}$ atoms/cm$^3$. However, it is not practical to dope the high resistivity CZ crystal having a resistivity of 100 Ωcm or more with such high concentration carbon as in the case of normal CZ crystal having a resistivity of 10 Ωcm or less. For example, with such high concentration carbon, there is a possibility of the CZ crystal generating dislocations or the like.

Based on the extensive research, the inventor found the carbon concentration rate exceeding 2° C./min is not preferable, since slip dislocation is easily caused.

Where the retention time of the wafer in the first heat treatment is shorter than the lower limit of the above-described range, there is a possibility that the residual interstitial oxygen concentration is not reduced sufficiently. Where the retention time in the first heat treatment exceeds the upper limit of the above-described time range, there is a case that the mechanical strength of the silicon wafer is deteriorated because of too low concentration of residual interstitial oxygen. In addition, where the retention time exceeds the upper limit of the above-described time range, there is an increased possibility of heavy metal contamination of the silicon wafer, and a high-production cost accompanies the heat treatment.

Based on the extensive study of inventor, it was found that oxygen donors such as new donors were further effectively depressed where the wafer, after the first heat treatment, was subjected to the second heat treatment in which the wafer was retained at 1200° C. for 1 to 2 hours in an atmosphere (non-oxidizing atmosphere) composed of argon, hydrogen or a mixed gas of argon and hydrogen.

An object for performing the second heat treatment is to form a denuded zone (DZ) layer (surface defect-free layer) and to grow the oxygen precipitation induced defects. It is interpreted that the oxygen donors are depressed by the second heat treatment since the thermal donors as the oxygen clusters or new donors that are BMDs in primary forms are dissolved or change the bonding form and are deactivated electrically by the high temperature heat treatment at 1200° C. or more.

Where the retention time in the second heat treatment is shorter than the lower limit of the above-described time range, there is a possibility that the residual interstitial oxygen concentration is not sufficiently reduced. Where the retention time in the above-described second heat treatment exceeds the upper limit of the above-described time range, there is a case that the mechanical strength of the silicon wafer is deteriorated because of too low concentration of the residual interstitial oxygen. In addition, where the retention time exceeds the upper limit of the above-described time range, there is a high possibility that the silicon wafer is contaminated with heavy metals. In addition, a high production cost is required accompanied with the heat treatment.

In addition, the inventor also found that even though a silicon wafer had a resistivity of 100 Ωcm or more, and a primary interstitial oxygen concentration of $8.0 \times 10^{17}$ to $16.0 \times 10^{17}$ atoms/cm$^3$, if the silicon wafer had a carbon concentration of $5 \times 10^{15}$ to $5 \times 10^{17}$ atoms/cm$^3$ and has been subjected to the above described first heat treatment or the first and the second heat treatments, and if the amount of generation of oxygen donors (increase of oxygen donor density) in the post process such as heat treatment during the device production process was $1 \times 10^{13}$ cm$^{-3}$, fluctuation of resistivity caused by the heat treatment during device production was inhibited, and resistivity of the wafer was not reduced by the heat treatment (hereafter referred to as device-production heat treatment) during the device production.

Where the primary concentration of interstitial oxygen is less than $8.0 \times 10^{17}$ atoms/cm$^3$, it may be difficult to obtain the silicon wafer from a silicon single crystal grown by the CZ method without using the MCZ method. Therefore, the primary interstitial oxygen concentration less than $8.0 \times 10^{17}$ atoms/cm$^3$ is not preferable. The primary interstitial oxygen concentration exceeding $16.0 \times 10^{17}$ atoms/cm$^3$ is not preferable. With such a primary interstitial oxygen concentration, it may be difficult to depress the generation of oxygen donors (increase of oxygen donor density) during the heat treatment of the device production to be $1 \times 10^{13}$ cm$^{-3}$ or less.

Oxygen donor density after the device-production heat treatment is determined being dependent on the heat treatment conditions during the device-production heat treatment and the concentration of interstitial oxygen before the device-production heat treatment. Therefore, the relation between the oxygen donor density after the device-production heat treatment and the interstitial oxygen concentration before the device-production heat treatment. The result is shown in FIG. 1.

FIG. 1 is a graph showing a relation between a residual interstitial oxygen concentration of a silicon wafer after a heat treatment yet before the device-production heat treatment and oxygen donor density of the wafer after the device-production heat treatment, where, in the heat treatment before the device-production heat treatment, the silicon wafer is heated up in argon gas atmosphere from 700° C. to 1200° C. with a heating rate of 1° C./min and retained at 1200° C. for 1 hour. In FIG. 1, residual interstitial oxygen concentration (residual [Oi]) denotes a concentration of interstitial oxygen contained in the silicon wafer before the device-production heat treatment.

As shown in FIG. 1, where the wafer is subjected to device-production heat treatment at 400° C. for 1 hour, the oxygen donor density can be depressed to be $1 \times 10^{13}$ cm$^{-3}$ or less, if the residual interstitial oxygen concentration is $13.5 \times 10^{17}$ atoms/cm$^3$ or less. Similarly, so as to control the oxygen donor density to be $1 \times 10^{13}$ cm$^{-3}$ or less, the residual interstitial oxygen concentration of $12.0 \times 10^{17}$ atoms/cm$^3$ or less is required where the wafer is subjected to a device-production heat treatment at 400° C. for 2 hours; the residual interstitial oxygen concentration of $9.5 \times 10^{17}$ atoms/cm$^3$ or less is required where the wafer is subjected to device-production heat treatment at 450° C. for 1 hours; the residual interstitial oxygen concentration of $7.5 \times 10^{17}$ atoms/cm$^3$ or less is required where the wafer is subjected to device-production heat treatment at 450° C. for 2 hours; the residual interstitial oxygen concentration of $6.5 \times 10^{17}$ atoms/cm$^3$ or less is required where the wafer is subjected to device-production heat treatment at 450° C. for 5 hours; and the residual interstitial oxygen concentration of $5.0 \times 10^{17}$ atoms/cm$^3$ or less is required where the wafer is subjected to a device-production heat treatment at 450° C. for 12 hours.

In the usual case, there is a possibility of oxygen donors being generated during sintering process for wiring performed after the formation of the P type region and the N type region in the high frequency diode. The sintering process is a device-production heat treatment and generally performed in conditions at 400° C. for 1 hour, or at 450° C. for 5 hours.

Therefore, it is preferable to control the residual interstitial oxygen concentration to be $13.5 \times 10^{17}$ atoms/cm$^3$ or less. With such residual interstitial oxygen concentration, the oxygen donor density can be depressed to be $1 \times 10^{13}$ cm$^{-3}$ or less after the device-production heat treatment at 400° C. for 1 hour. On the other hand, where the residual interstitial oxygen concentration is less than $6.5 \times 10^{17}$ atoms/cm$^3$ or less, the oxygen donor density can be depressed to be $1 \times 10^{13}$ cm$^{-3}$ or less after the device-production heat treatment at 450° C. for 5 hours, but the mechanical strength of the wafer is deteriorated. In addition, in order to control the residual interstitial oxygen concentration to be less than $6.5 \times 10^{17}$ atoms/cm$^3$, there is a possibility that further heat treatment for a long time is required in addition to the above-described device-production heat treatment, thereby causing a problem of heavy metal contamination of the silicon wafer in the heat treatment furnace, and a high production cost accompanied with the heat treatment. Therefore, the residual interstitial oxygen concentration is preferably $6.5 \times 10^{17}$ atoms/cm$^3$ or more.

Based on the above-described findings, a silicon wafer of the present invention has a carbon concentration of $5 \times 10^{15}$ to $5 \times 10^{17}$ atoms/cm$^3$, interstitial oxygen concentration of $6.5 \times 10^{17}$ to $13.5 \times 10^{17}$ atoms/cm$^3$; and resistivity of 100 Ωcm or more.

Since the silicon wafer of the present invention does not occur a reduction of resistivity by the sintering heat treatment during the device-production heat treatment, the silicon wafer is optimum for production of high frequency diode having a high resistivity layer of sufficiently high resistivity and generating low noise. In addition, by controlling the interstitial oxygen concentration of the silicon wafer to be $6.5 \times 10^{17}$ to $10.0 \times 10^{17}$ atoms/cm$^3$, reduction of resistivity is inhibited even though the device-production heat treatment is performed at relatively high temperature, for example, 450° C.

In addition, since the silicon wafer has a carbon concentration of $5 \times 10^{15}$ to $5 \times 10^{17}$ atoms/cm$^3$ and interstitial oxygen concentration of $6.5 \times 10^{17}$ to $13.5 \times 10^{17}$ atoms/cm$^3$ or more, oxygen precipitation induced defects are ensured to have a density sufficient for gettering, and generation of oxygen donors during the device-production heat treatment is effectively depressed. In addition, since the generation of excessive oxygen precipitation induced defects is inhibited, the wafer has a sufficient mechanical strength.

In addition, according to the silicon wafer of the present invention, since sufficient oxygen precipitation induced defects can be ensured in the silicon wafer, the oxygen precipitation induced defects can be used as recombination centers in the high resistivity layer interposed between P type region and N type region of the high-frequency diode. As a result, where a high-frequency diode is manufactured using the above-described silicon wafer, formation of recombination centers in the high resistivity layer is not necessary, and the production process of a diode can be contracted. Therefore, it is possible to manufacture a high frequency diode easily at low cost.

On the contrary, if a silicon wafer is obtained from a CZ crystal produced by the MCZ method and has a low interstitial oxygen concentration, device heat treatment process of the silicon wafer generates oxygen precipitation induced defects to a low density insufficient for using the oxygen precipitation induced defects as the recombination centers.

In addition, by providing the silicon wafer with a resistivity of 600 to 1000 Ωcm, it is possible to manufacture a high quality high frequency diode having a high resistivity layer of very high resistivity and extremely low noise by using the silicon wafer.

A silicon wafer according to the present invention may be obtained by a production method comprising: performing crystal growth of a silicon single crystal by the CZ method such that the silicon single crystal has a resistivity of 100 Ωcm or more, primary interstitial oxygen concentration of $8.0 \times 10^{17}$ to $16.0 \times 10^{17}$ atoms/cm$^3$, carbon concentration of $5 \times 10^{15}$ to $5 \times 10^{17}$ atoms/cm$^3$; and performing a first heat treatment, where a temperature of a silicon wafer sliced from the silicon single crystal is increased from 700° C. to 1000° C. with a heating rate of 1 to 2° C./min in an atmosphere composed of argon, nitrogen, or a mixed gas of argon and nitrogen.

In the above-described method for producing a silicon wafer, the silicon wafer may be retained for 0 to 6 hours at 1000° C. in the first heat treatment. Generation of oxygen donors in the device-production heat treatment is further effectively depressed in a silicon wafer produced by the method.

The above-described method for producing a silicon wafer may further comprise a second heat treatment where the silicon wafer after being subjected to the first heat treatment is retained for 1 to 2 hours at 1200° C. in an atmosphere composed of argon, hydrogen, or mixed gas of argon and hydrogen. In a silicon wafer produced by such a method, generation of oxygen donors in the device-production heat treatment is further effectively reduced.

In the above-described method for producing a silicon wafer, occurrence of heavy metal contamination of die silicon wafer in a heat treatment furnace is inhibited because of a relatively short duration of the heat treatment. Therefore, the above-described silicon wafer may be produced with high quality and at a low cost.

Since a silicon single crystal grown by the CZ method is used in the above-described method for producing a silicon wafer, it is easy to produce a silicon wafer having a large diameter. In addition, since the silicon single crystal may have a primary oxygen concentration of $8.0 \times 10^{17}$ to $16.0 \times 10^{17}$ atoms/cm$^3$, the silicon single crystal may be obtained without using the MCZ method. Therefore, it is possible to reduce the production cost of the silicon wafer by omission of application of a magnetic field during crystal growth of the silicon single crystal.

By the use of the silicon wafer of the present invention, generation of oxygen donors during the device-production heat treatment is effectively reduced, and occurrence of the oxygen precipitation induced defects can be controlled at a desirable state. Therefore, the silicon wafer has sufficient mechanical strength, and the oxygen precipitation induced defects are prevented from causing slip dislocations. By the use of such a silicon wafer in the production of a high frequency diode, it is possible to use the oxygen precipitation induced defects as recombination centers in the high resistivity layer interposed between the P type region and the N type region of the high frequency diode. Since it is not necessary to perform a further treatment for forming the recombination center (recombination center constituted of Au or Pt, or electron beam irradiation defects or the like) for controlling lifetime, it is possible to reduce the number of steps in the production process of the high frequency diode. Since the above-described silicon wafer has a sufficient ability for gettering and the resistivity is not deviated from the preferable range by the device-production heat treatment, it is possible to shorten the treatment time and reduce the production cost. Therefore, the silicon wafer provided by the present invention is preferably applicable for manufacturing of a high frequency diode which is inexpensive, has high quality, has a high resistivity layer having sufficiently high resistivity, and generates few noise.

BRIEF DESCRIPTION OF THE DRAWINGS

FIG. 4A shows the energy diagram of the PIN diode shown in FIG. 3A. FIG. 4B shows an energy diagram of a conventional PIN diode in which heavy metals are thermally diffused as recombination centers.

DETAILED DESCRIPTION OF THE INVENTION

In the following, the present invention is explained in detail with reference to the drawings.

A silicon wafer according to the present invention has a carbon concentration of $5 \times 10^{15}$ to $5 \times 10^{17}$ atoms/cm$^3$, interstitial oxygen concentration of, and an interstitial oxygen concentration of $6.5 \times 10^{17}$ to $13.5 \times 10^{17}$ atoms/cm$^3$, and a resistivity of 100 Ωcm or more. The resistivity of the silicon wafer is not reduced by the sintering heat treatment during the device production process.

In the following and foregoing description of the present invention, "oxygen concentration" denotes a concentration of oxygen determined based on ASTM F121-1979 (Old ASTM), and "carbon concentration" denotes a concentration of carbon determined based on ASTM F123-1981.

In the production process of the silicon wafer constituting the I layer of the high frequency diode according to the invention, firstly, a silicon single crystal is grown by the CZ method (single crystal growth step) such that the silicon single crystal has a resistivity of 100 Ωcm or more, a primary interstitial oxygen concentration of $8.0 \times 10^{17}$ to $16.0 \times 10^{17}$ atoms/cm$^3$, and a carbon concentration of $5 \times 10^{15}$ to $5 \times 10^{17}$ atoms/cm$^3$.

In that step, a silicon single crystal having the above-described preferable properties can be grown by controlling crystal pulling conditions such as the rotation cycle of a crucible, the species and flow rate of a gas introduced into the chamber of a pulling apparatus, the temperature distribution of a silicon melt, the convection of the silicon melt or the like.

Next, the thus obtained silicon single crystal is sliced using a cutting apparatus such as a wire saw, a slicer or the like. Where necessary, the sliced piece of the silicon single crystal is subjected to steps such as facing, lapping, etching, polishing or the like and is worked to a silicon wafer.

Figure 1:
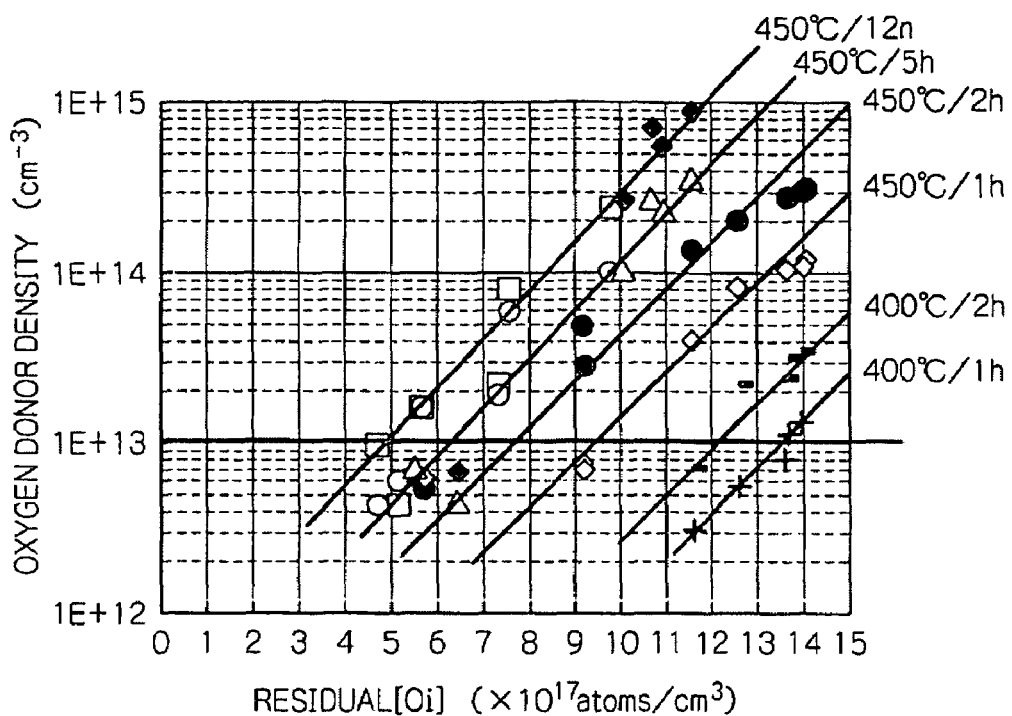
FIG. 1 is a graph showing a relation between the residual interstitial oxygen concentration of a silicon wafer after the first heat treatment and the second heat treatment and oxygen donor density of the silicon wafer which has been subjected to the device-production heat treatment after the first and second heat treatment.
Figure 2:
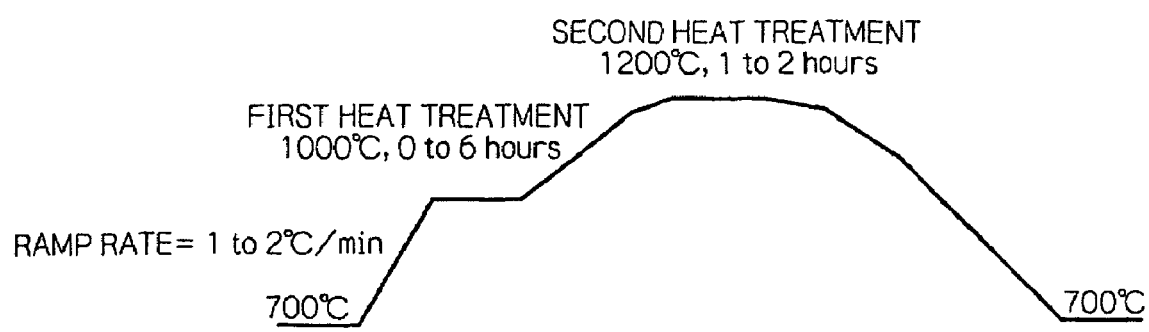
FIG. 2 is a graph for explaining a heat treatment rate according to the present invention.

Next, as shown in FIG. 2, the silicon wafer is subjected to a first heat treatment, for example, using a heat treatment furnace employing a lamp heating mechanism in an atmosphere composed of argon, nitrogen, or a mixed gas of argon and nitrogen. In the first heat treatment, the heating temperature of the silicon wafer is increased from 700° C. to 1000° C. with a heating rate (temperature increasing rate) of 1 to 2° C./min, and the silicon wafer is retained for 0 to 6 hours at 1000° C. Further, as shown in FIG. 2, after the first heat treatment, the silicon wafer is subjected to a second heat treatment. For example, the second heat treatment may be performed by a similar heat treatment furnace employing lamp heating mechanism as in the first heat treatment. In the second heat treatment, the silicon wafer is heated to 1200° C. and retained at 1200° C. for 1 to 2 hours in an atmosphere composed of argon, hydrogen, or a mixed gas of argon and hydrogen, then cooled. As a result, a silicon wafer according to the present invention is obtained.

Next, a high-frequency diode employing the above-described silicon wafer of the invention is explained.

Figure 3A:
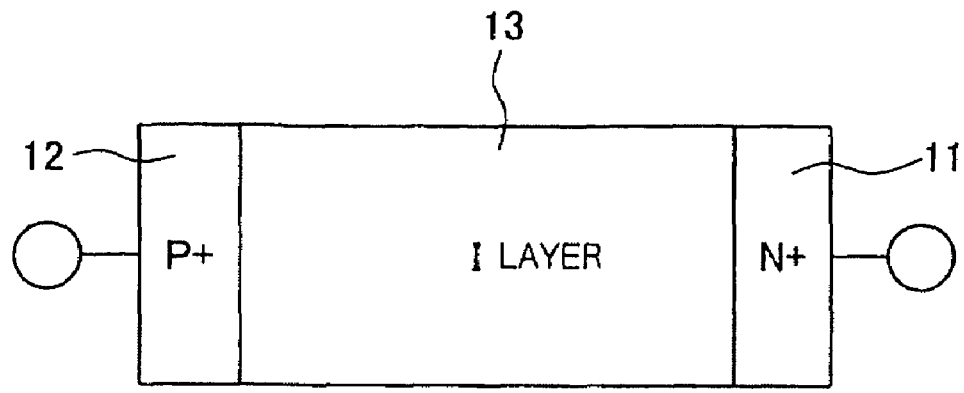
FIGS. 3A through 3C are schematic cross sections explaining examples of high frequency diodes made of silicon wafers according to the present invention.
Figure 3B:
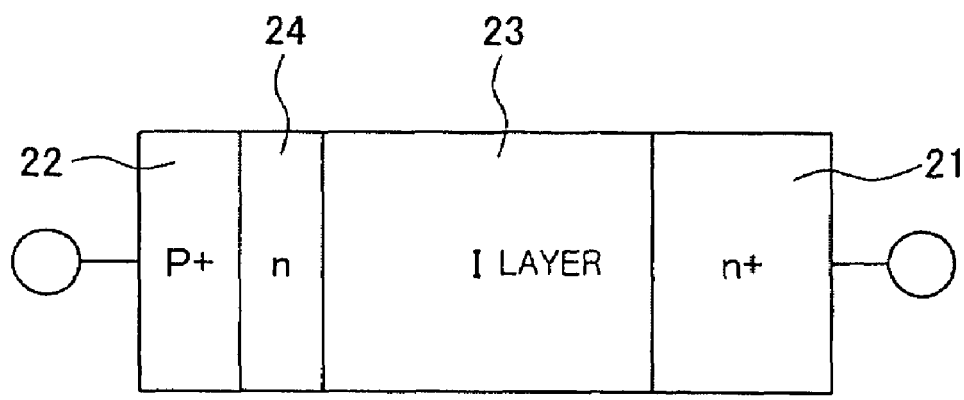
Figure 3C:
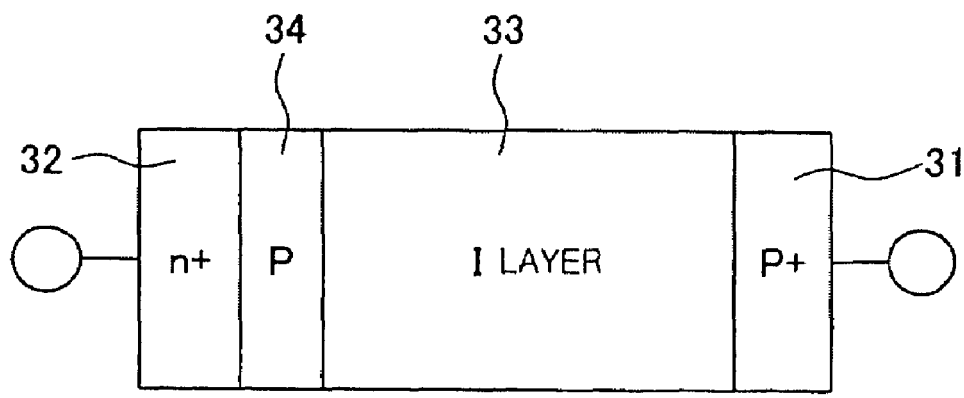

FIGS. 3A, 3B, and 3C are schematic cross sections for explaining high-frequency diodes produced using the silicon wafer according to the invention. The high-frequency diode shown in FIG. 3A is a PIN diode where a P type region 12, an N type region 11, and a high-resistivity layer (I layer) 13 interposed between the P type region 12 and the N type region 11 are formed in the above-described silicon. In the high-frequency diode shown in FIG. 3A, BMDs in the silicon wafer are used as recombination centers of the high resistivity layer 13.

The high-frequency diode shown in FIG. 3A can be produced by the following procedure.

Firstly, above-described silicon wafer is prepared. Next, boron (B) is diffused to a depth of about 2 μm from the wafer surface such that the boron concentration at that depth is $1 \times 10^{18}$ atoms/cm$^3$. The above-described diffusion of boron may be performed by thermal diffusion method at a temperature of about 1000° C. or by an ion implantation method.

Next to the back surface of the wafer, that is, to the surface opposite to the boron-diffused surface of the wafer, phosphorus (P) is diffused to a depth of about 2 μm from the back surface such that the P concentration at that depth is about $1 \times 10^{18}$ atoms/cm$^3$. The above-described diffusion of phosphorus may be performed by a thermal diffusion method at a temperature of about 850° C. or by ion implantation method.

Next, an Au electrode is formed on the surface of the silicon wafer by electron beam evaporation, and an Al electrode is formed on the back surface of the silicon wafer by electron beam evaporation.

After that, a diode is sliced from the silicon wafer and is subjected to mesa etching. After the mesa etching, silicone resin is applied to the etched surface (passivation treatment of the end face).

FIG. 3B is a schematic cross section for explaining the other example of a high-frequency diode according to the present invention produced from the above-described silicon wafer. In the high-frequency diode shown in FIG. 3B, BMDs in the silicon wafer are also used as recombination centers in the high resistivity layer.

The high-frequency diode shown in FIG. 3B is an IMPATT diode where a p+ layer 22, an n+ layer 21, a high resistivity layer (I layer) 23, and an n layer 24 interposed between the p+ layer 22 and the high-frequency layer (I layer) 23 are formed in the above-described silicon wafer. IMPATT diode is an oscillating element utilizing a negative resistance.

In the IMPATT diode, carriers generated by impact ionization in the semiconductor are moved with a saturated drift velocity. In that time, the phase of the electric current by the generated carrier and the phase of the applied voltage shows a phase difference of π/2, and the substantial component of resistance is negative, that is, negative resistance is made apparent.

The high-frequency diode shown in FIG. 3B can be produced using a similar method as the production of the above-described PIN diode by forming a p+ layer 22, an n+ layer 21, a high-frequency layer (I layer) 23, and an layer 24 in the silicon wafer.

FIG. 3C is a schematic cross section for explaining another example of a high-frequency diode according to the present invention made of the above-described silicon wafer. In the high-frequency diode shown in FIG. 3C, BMDs in the silicon wafer are also used as recombination centers in the high resistivity layer.

The high frequency diode shown in FIG. 3C is an IMPATT diode where a p+ layer 31, an n+ layer 32, a high resistivity layer (I layer) 33, and a p layer 34 interposed between the p+ layer 32 and the high resistivity layer (I layer) 33 are formed in the silicon wafer.

The high-frequency diode shown in FIG. 3C can be produced by a similar process as the production process of the above-described PIN diode, by forming the p+ layer 31, the n+ layer 32, the high resistivity layer (I layer) 33, and the p layer 34 in the silicon wafer.

Figure 4A:
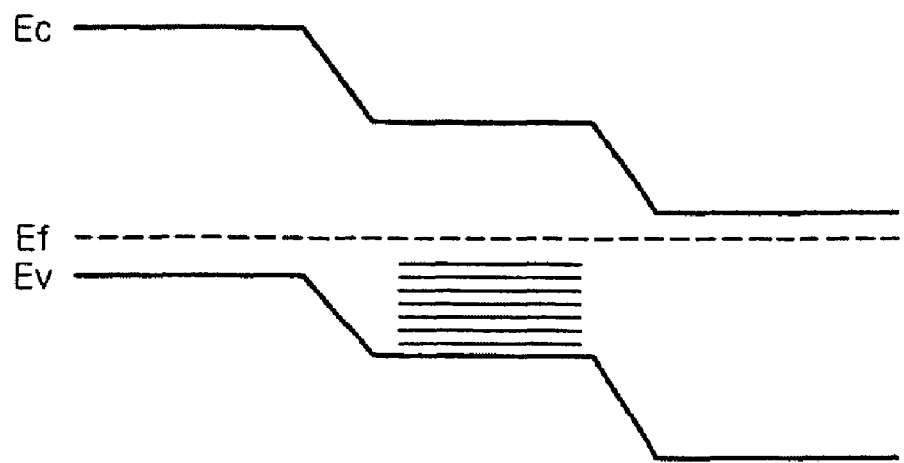
FIGS. 4A and 4B are drawings for explaining the energy diagram of a PIN diode.
Figure 4B:
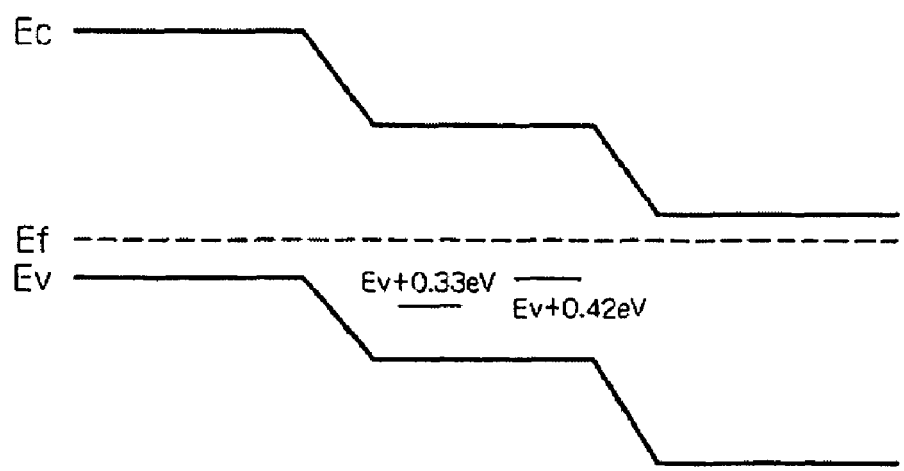
Figure 5:
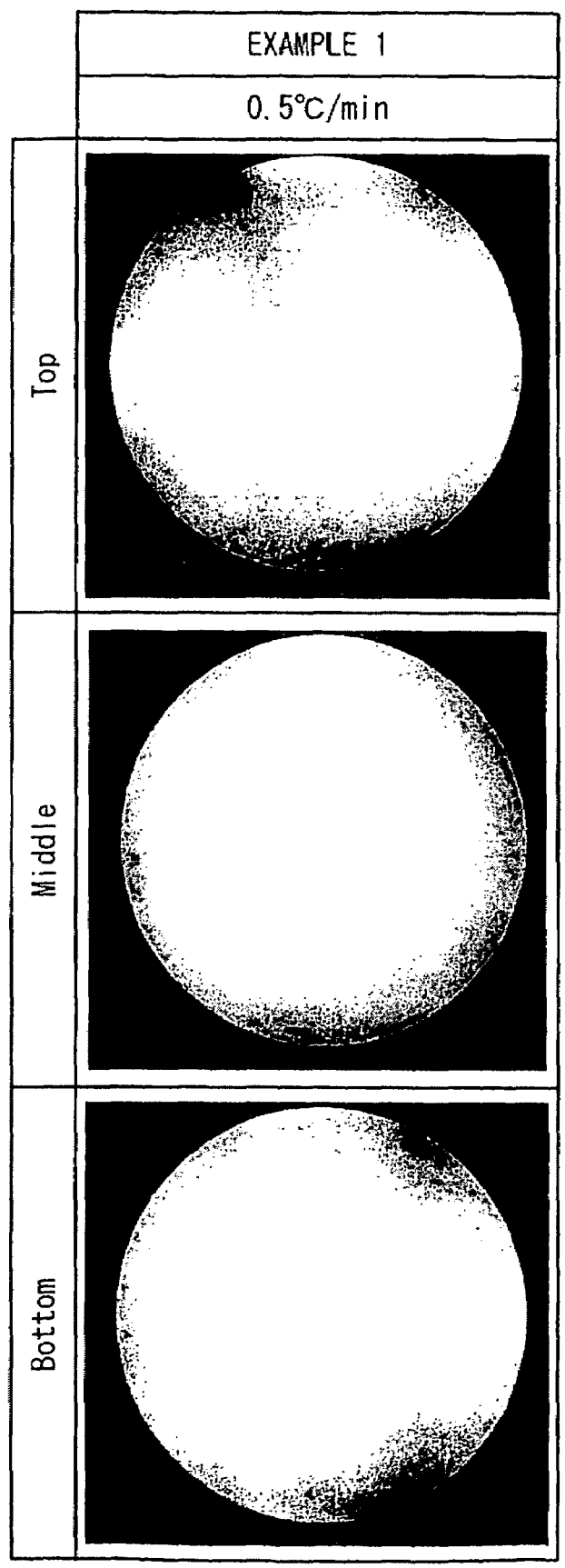
FIG. 5 is an image showing occurrence of slip in Experiment 1.
Figure 6:
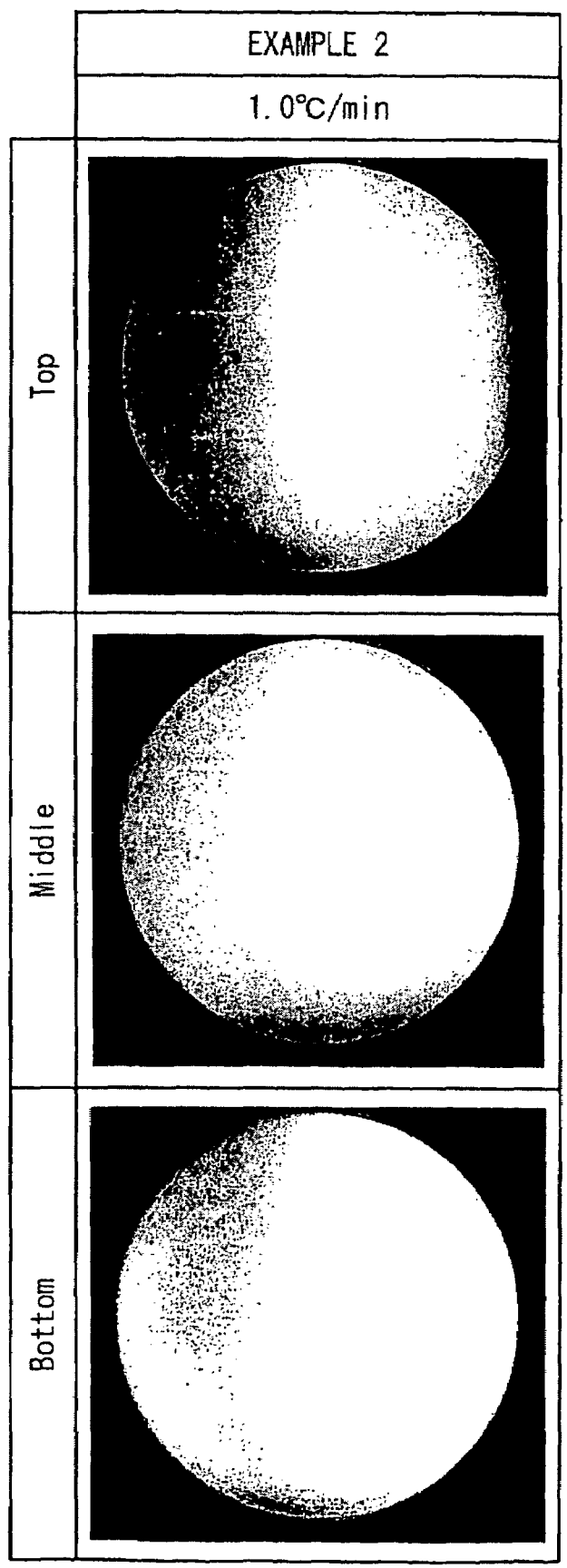
FIG. 6 is an image showing occurrence of slip in Experiment 2.
Figure 7:
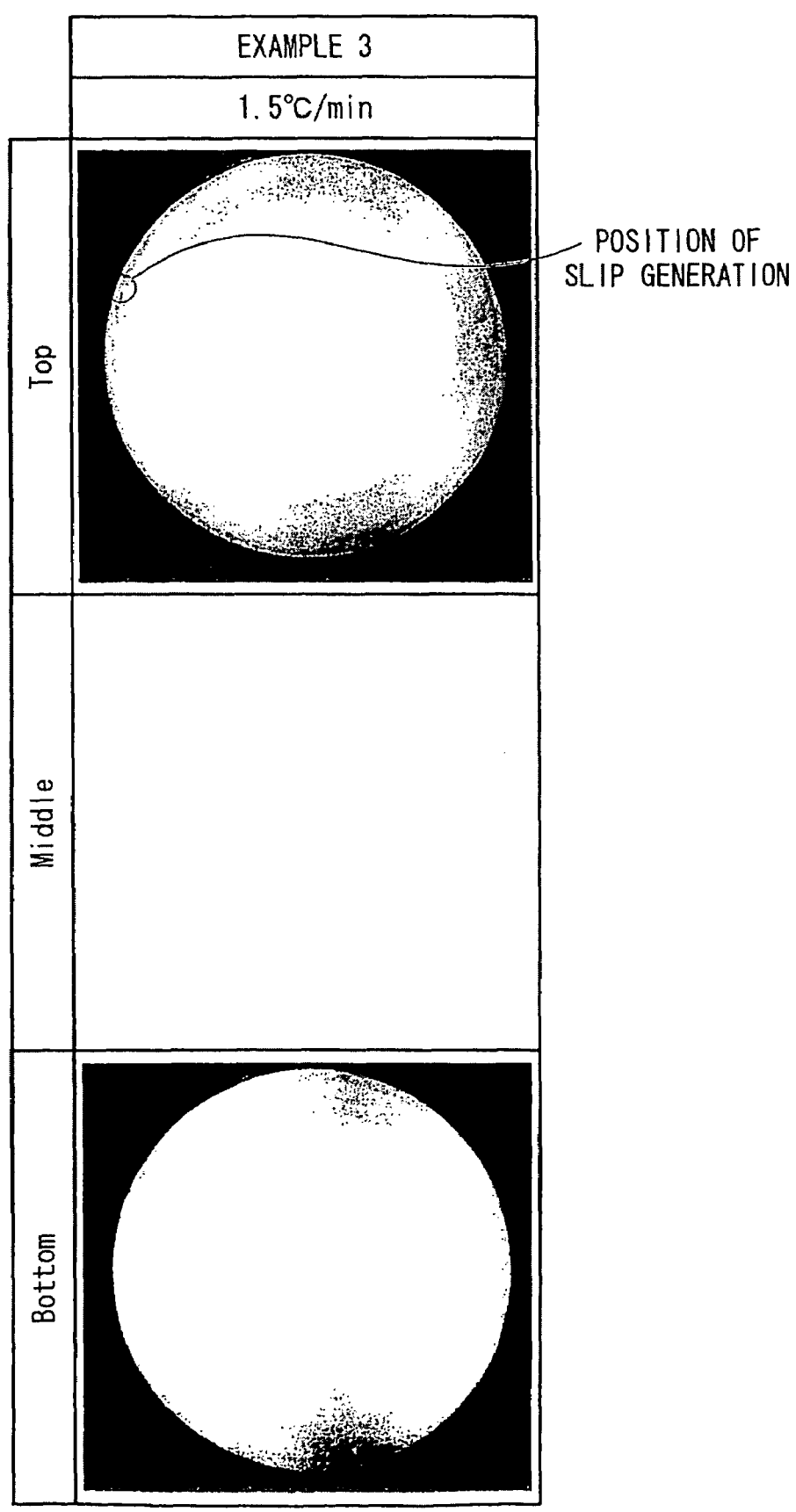
FIG. 7 is an image showing occurrence of slip in Experiment 3.
Figure 8:
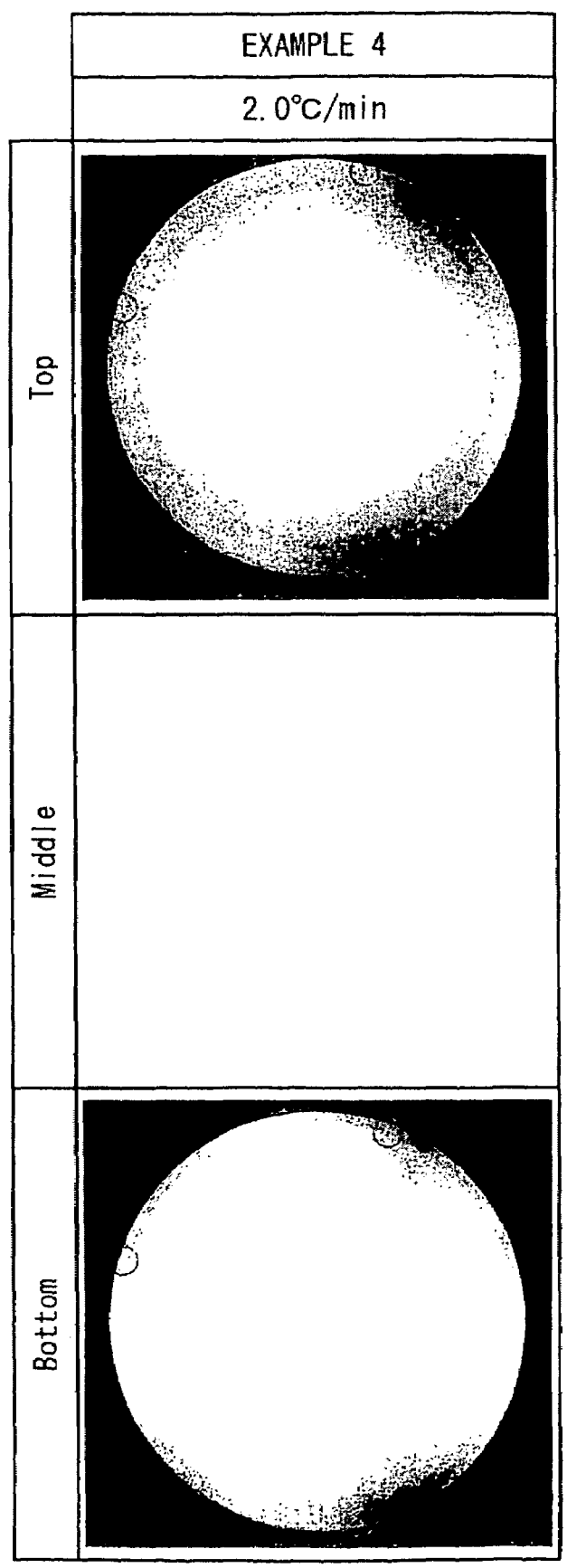
FIG. 8 is an image showing occurrence of slip in Experiment 4.

Next, the energy diagram of the PIN diode shown in FIG. 3A is explained. FIGS. 4A and 4B are graphs for explaining the energy diagrams of PIN diodes. FIG. 4A shows an energy diagram of a PIN diode shown in FIG. 3A, and FIG. 4B shows an energy diagram of a conventional PIN diode where heavy metals are thermally diffused as recombination centers. In FIGS. 4A and 4B, symbol Ec denotes an energy of bottom level of conduction band, symbol Ef denotes a Fermi level, and symbol Ev denotes an energy of the top level of valence electron band.

As shown in FIG. 4B, switching rate of the conventional PIN diode strongly depends on an activation energy of deep energy level of thermally diffused heavy metals, the capture cross section, and the concentration of the heavy metals. For example, as shown in FIG. 4B, where Pt is thermally diffused as the heavy metals, a deep energy level is formed in Ev+0.33 eV and the lifetime is determined. As shown in FIG. 4B, where Au and Pt are diffused as heavy metals, a deep energy level is formed in Ev+0.42 eV and the lifetime is determined.

On the other hand, as shown in FIG. 4A, in the PIN diode made of the silicon wafer according to the present invention, a deep energy level introduced by the BMDs in the silicon wafer is formed continuously from the top energy level Ev of the valence electron band to Fermi level. Therefore, compared with the conventional PIN diode shown in FIG. 4B, lifetime can be controlled within a wide range, and controlling range of the switching rate has a large degree of freedom.

EXAMPLES 1 THROUGH 4

Figure 13:
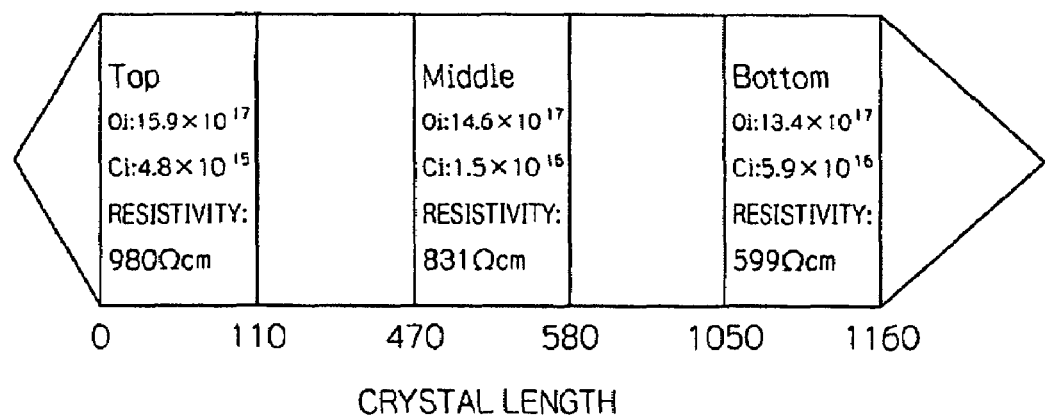
FIG. 13 is a graph showing crystal portions and crystal length of the silicon single crystal used in the Examples 1 through 4.

A silicon single crystal having a crystal length of 1160 mm shown in FIG. 13 was grown by the CZ method and silicon wafers were sliced from the single crystal. From each of the Top, Middle, and Bottom portions of the crystal shown in FIG. 13, 50 mirror-polished wafers were obtained. The followings are the average values of resistivity, primary interstitial oxygen concentration, and carbon concentration of each portions: the Top portion had an resistivity of 980 Ωcm, primary interstitial oxygen concentration of $15.9 \times 10^{17}$ atoms/cm$^3$ (OLD ASTM), and carbon concentration of $4.8 \times 10^{15}$ atoms/cm$^3$; the Middle portion had a resistivity of 831 Ωcm, primary interstitial oxygen concentration of $14.6 \times 10^{17}$ atoms/cm$^3$ (OLD ASTM), and carbon concentration of $1.5 \times 10^{16}$ atoms/cm$^3$; and the Bottom portion had a resistivity of 599 Ωcm, primary interstitial oxygen concentration of $13.4 \times 10^{17}$ atoms/cm$^3$ (OLD ASTM) and carbon concentration of $5.9 \times 10^{16}$ atoms/cm$^3$.

Silicon wafers obtained from each portions were subjected to a heat treatment using a heat treatment furnace employing a lamp heating mechanism. In an argon atmosphere, heating temperature of the wafer was increased from 700° C. to 1000° C. with a heating rate selected from 0.5° C./min, 1.0° C./min, 1.5° C./min, and 2.0° C./min. After the heat treatment, a thermal stress of 4 MPa was applied to each silicon wafer, and occurrence of slip was examined. The results are shown in FIGS. 5 through 8.

The examination of the occurrence of slip was made by observation of X-ray photograph. Occurrence of slip was acknowledged where a slip of 1 mm or longer was observed.

EXAMPLE 5

Figure 9:
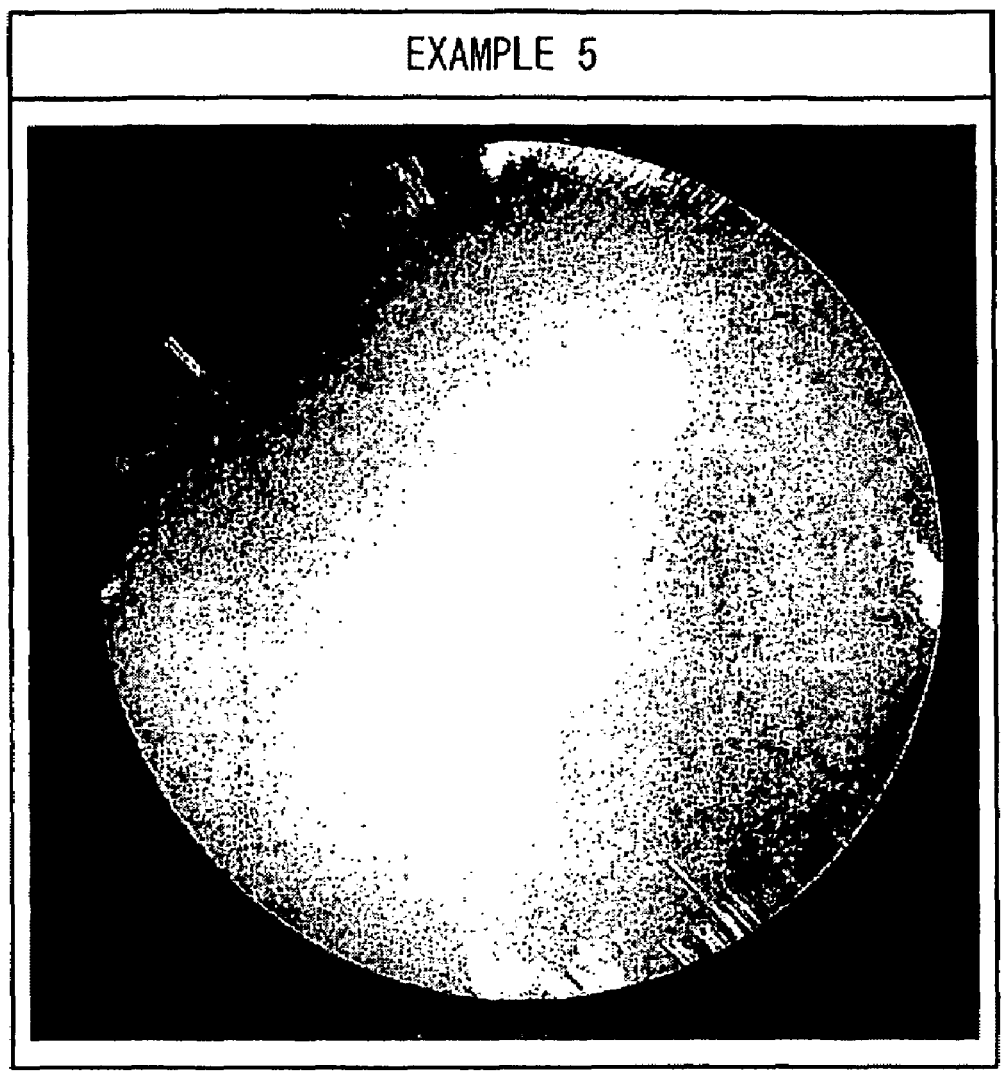
FIG. 9 is an image showing occurrence of slip in Experiment 5.

A silicon single crystal having a resistivity of 1000 Ωcm, a primary interstitial oxygen concentration of $14.5 \times 10^{17}$ atoms/cm$^3$ (OLD ASTM) was grown by the CZ method. Silicon wafers sliced from the silicon single crystal were subjected to a heat treatment. Using a heat treatment furnace employing the lamp heating mechanism, heating temperature of the wafer was increased from 700° C. to 1000° C. with a heating rate of 5° C./min. After the heat treatment, thermal stress of 4 MPa was applied to the wafers and occurrence of slip was examined in the same manner as in the above-described Examples 1 to 4. The results are shown in FIG. 9.

As shown in FIGS. 5 through 9, irrespective of the crystal portions of the silicon single crystal, wafers in Examples 2 through 4 heated with a heating rate of 1.0 to 2.0° C./min showed fewer occurrences of slip compared with Example 5. Wafers in Example 3 heated with a heating rate of 1.5° C./min showed fewer occurrences of slip compared with wafers of Example 4 heated with a heating rate of 2.0° C./min. In the Example 4, slip occurred in both sides of the wafer, whereas in Example 3, slip occurred only in the back surface of the wafer. In the Example 2 where the wafer was heated with a heating rate of 1.0° C./min, slip was not observed. In the Example 1 using a heating rate of 0.5° C./min, an excessive amount of fine oxygen precipitation induced defects occurred in the silicon wafer and the oxygen precipitation induced defects caused slips to occur.

EXAMPLE 6

A silicon single crystal having a resistivity of 1000 Ωcm, primary interstitial oxygen concentration of $14.5 \times 10^{17}$ atoms/cm$^3$ (OLD ASTM), and a carbon concentration of $1.5 \times 10^{16}$ atoms/cm$^3$ was grown by the CZ method. Silicon wafers sliced from the silicon single crystal were subjected to a heat treatment. Using a heat treatment furnace employing the lamp heating mechanism, heating temperature of the wafer was increased from 700° C. to 1000° C. where the heating rate was selected from the various rates within the range of 1 to 2° C./min and retained at 1000° C. for a duration selected from various durations in a range of 0 to 6 hours. After the heat treatment, relation between the heat treatment condition and residual interstitial oxygen concentration was examined. The results are shown in FIG. 10.

Figure 10:
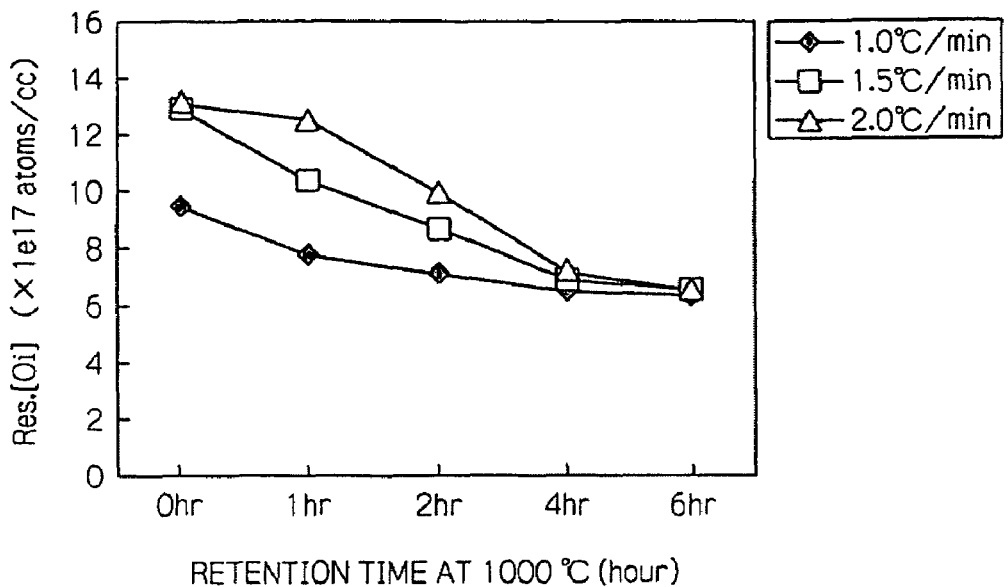
FIG. 10 is a graph showing relations between heating rate, retention time at 1000° C., and residual interstitial oxygen concentration (Res. [Oi]).

FIG. 10 is a graph showing the relation between a heating rate, a retention time at 1000° C., and a residual interstitial oxygen concentration (Res. [Oi]). As shown in FIG. 10, residual interstitial oxygen showed a low concentration as the heating rate had a slow value. In addition, irrespective of the heating rate, the residual interstitial oxygen concentration decreased with increasing retention time. In addition, it was confirmed that residual interstitial oxygen concentration showed a large decrease under a retention time of up to 2 hours, and the residual interstitial oxygen concentration was remarkably reduced. In addition, it was confirmed that, by selecting a heat treatment condition during the first heat treatment, the residual concentration of interstitial oxygen of a silicon wafer primarily having a interstitial oxygen concentration of $14.5 \times 10^{17}$ atoms/cm$^3$ (OLD ASTM) could be controlled within a range from $6.5 \times 10^{17}$ to $13.5 \times 10^{17}$ atoms/cm$^3$.

EXAMPLE 7

Figure 11:
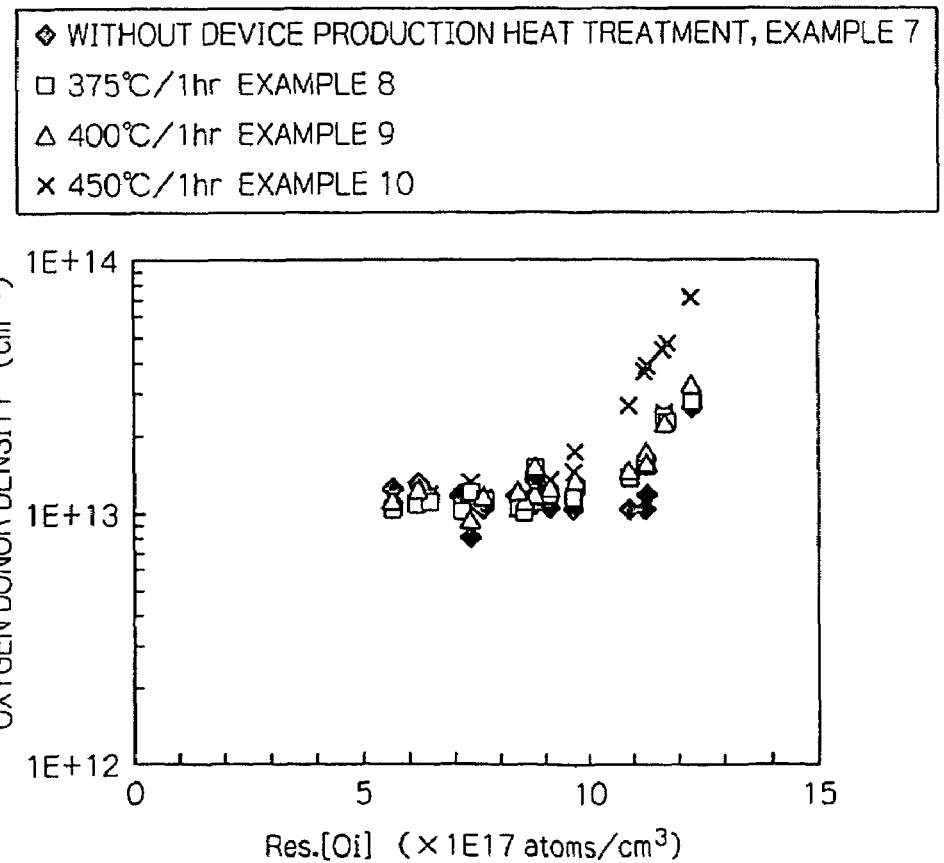
FIG. 11 is a graph showing the relation between heat treatment conditions, oxygen donor density, and residual interstitial oxygen concentration (Res. [Oi]).

A silicon single crystal having a resistivity of 1300 Ωcm, a primary interstitial oxygen concentration of $14.5 \times 10^{17}$ atoms/cm$^3$ (OLD ASTM), and carbon concentration of $1.5 \times 10^{16}$ atoms/cm$^3$ was grown by the CZ method. Silicon wafers sliced from the silicon single crystal were subjected to a first heat treatment using a heat treatment furnace employing the lamp heating mechanism, in an argon atmosphere. Heating temperature of the wafer was increased from 700° C. to 1000° C. with a heating rate of 1° C./min and retained at 1000° C. for 0 hour. After the first heat treatment, the silicon wafers were subjected to a second heat treatment for heating the wafer at 1200° C. for 1 hour. Thus heat treated silicon wafers had a carbon concentration of $1.0 \times 10^{16}$ atoms/cm$^3$, residual interstitial oxygen. concentration of $6.5 \times 10^{17}$ to $13.5 \times 10^{17}$ atoms/cm$^3$, and resistivity of 1000 Ωcm. The relation between oxygen donor density and residual interstitial oxygen concentration (Res. [Oi]) is shown in FIG. 11.

EXAMPLES 8 THROUGH 10

The silicon wafers which were obtained in the Example 7 and had a residual interstitial oxygen concentration of $6.5 \times 10^{17}$ to $13.5 \times 10^{17}$ atoms/cm$^3$ were subjected to a device-production heat treatment where each of the wafers was retained for 1 hour at a temperature selected from the temperature range from 375° C. to 450° C. The relation between the heat treatment condition, the oxygen donor density, and the residual interstitial oxygen concentration (Res. [Oi]) was examined. The results are shown in FIG. 11.

Silicon wafers of the Example 7 before the device-production heat treatment and silicon wafers of Example 8 to 10 after the device-production heat treatment for 1 hour at 375 to 450° C. were compared. As shown in FIG. 11, where the residual interstitial oxygen concentration (Res. [Oi]) before the device-production heat treatment was $6.5 \times 10^{17}$ to $10.0 \times 10^{17}$ atoms/cm$^3$, amounts of generated oxygen donors (increase of oxygen donor density) during the device-production heat treatment was depressed to be $1 \times 10^{13}$ cm$^{-3}$ or less in each of the wafers of Examples 8 though 10. Therefore, it was confirmed that in Examples 8 through 10, by the depression of fluctuation of resistivity during the device-production heat treatment, high resistivity was retained after the device-production heat treatment. In addition, FIG. 11 showed that, where the residual interstitial oxygen concentration (Res. [Oi]) before the device-production heat treatment was $6.5 \times 10^{17}$ to $11.5 \times 10^{17}$ atoms/cm$^3$, the amount of generated oxygen donors (increase of oxygen donor density) during the device-production heat treatment for 1 hour at 375 to 400° C. was $1 \times 10^{13}$ cm$^{-3}$ or less in each of the wafers of Examples 9 through 10.

EXAMPLE 11

A silicon single crystal having a resistivity of 600 to 1000 Ωcm, a primary interstitial oxygen concentration of $13.0 \times 10^{17}$ to $16.0 \times 10^{17}$ atoms/cm$^3$ (OLD ASTM), and a carbon concentration of $5 \times 10^{15}$ to $6 \times 10^{16}$ atoms/cm$^3$ was grown by the CZ method. Silicon wafers were sliced from the silicon single crystal and were subjected to an examination of the relation between the crystal portion and resistivity. The results are shown in FIG. 12.

Figure 12:
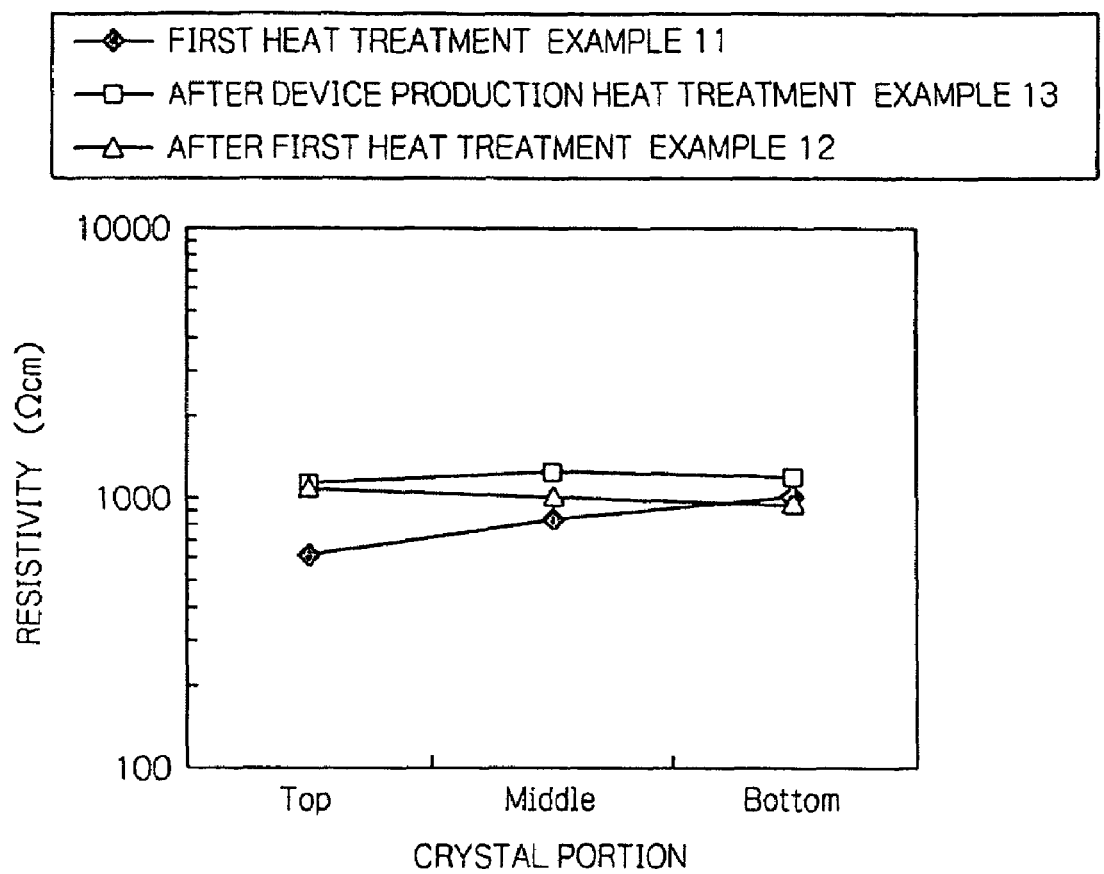
FIG. 12 is a graph showing the relation between crystal portions of a silicon single crystal and resistivity of the each portions.

As shown in FIG. 12, it was confirmed that the resistivity gradually increased from the Top portion to the Bottom portion of the single crystal.

EXAMPLE 12

The silicon wafers obtained by the Example 11, were subjected to a first heat treatment using a heat treatment furnace employing a lamp heating mechanism, in an argon gas atmosphere. The heating temperature of the silicon wafer was increased from 700° C. to 1000° C. with a heating rate of 1° C./min, and was retained at 1000° C. for 0 hour. After the first heat treatment, the silicon wafers had a residual interstitial oxygen concentration of $8.0\times10^{17}$ atoms/cm$^3$ and a resistivity of 1000 Ωcm. The relation between the crystal portions of the silicon single crystal from which the silicon wafers had been obtained and resistivity is shown in FIG. 12.

As shown in FIG. 12, the Example 12 after the first heat treatment shows a relatively increased resistivity irrespective of the crystal portion compared with the Example 11. In addition, variations of resistivity depending on the difference in crystal portion of the single crystal was decreased in the Example 12.

In addition, total time for the first heat treatment in the Example was 14.5 hours. On the other hand, the 4-step heat treatment described in Patent Reference 1 and Patent Reference 3 required total heat treatment time up to 47 hours. Therefore, compared with the conventional art, about 60% of the heat treatment time was reduced and cost for the heat treatment could be remarkably reduced.

EXAMPLE 13

The silicon wafers obtained by the Example 12 were subjected to a device-production heat treatment at 450° C. for 1 hour. Thus obtained silicon wafers had a residual interstitial oxygen concentration of $8.0\times10^{17}$ atoms/cm$^3$ and a resistivity of 1000 Ωcm. The relation between the resistivity and the crystal portion of the silicon single crystal from which the silicon wafer has been obtained was shown in FIG. 12.

As shown in FIG. 12, in the Example 13 after the device-production heat treatment resistivity of the silicon wafer was increased compared with Example 11 yet before the first heat treatment. In addition, silicon wafers obtained from the Top portions of the single crystal showed a similar resistivity in Example 13 and Experimental Example 12 after the first heat treatment. While in Example 13, silicon wafers obtained from Middle portion and Bottom portion had increased resistivity compared with the silicon wafers obtained from the same portions in FIG. 12 after the first heat treatment.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method for producing a silicon wafer having a carbon concentration of $5\times10^{15}$ to $5\times10^{17}$ atoms/cm$^3$, an interstitial oxygen concentration of $6.5\times10^{17}$ to $13.5\times10^{17}$ atoms/cm$^3$, and a resistivity of 100 Ωcm or more, comprising:

performing the crystal growth of a silicon single crystal by the CZ method such that the silicon single crystal has a resistivity of 100 Ωcm or more, a primary interstitial oxygen concentration of $8.0\times10^{17}$ to $16.0\times10^{17}$ atoms/cm$^3$, and a carbon concentration of $5\times10^{15}$ to $5\times10^{17}$ atoms/cm$^3$; and performing a first heat treatment where a silicon wafer sliced from the silicon single crystal is heated in an atmosphere composed of argon, nitrogen, or a mixed gas of argon and nitrogen, and the heating temperature of the wafer is increased from 700° C. to 1000° C. with a heating rate of 1 to 2° C./min.

2. A method for producing a silicon wafer according to claim 1, wherein the first heat treatment comprises retaining the silicon wafer at 1000° C. for 0 to 6 hours.

3. A method for producing a silicon wafer according to claim 1, further comprising performing a second heat treatment where the silicon wafer which has been subjected to the first heat treatment is retained at 1200° C. for 1 to 2 hours in an atmosphere composed of argon, hydrogen, or a mixed gas of argon and hydrogen.

4. A method for producing a silicon wafer according to claim 1, wherein the silicon wafer produced by the method has an interstitial oxygen concentration of $6.5\times10^{17}$ to $10.0\times10^{17}$ atoms/cm$^3$.

* * * * *